(12) United States Patent
Gao (10) Patent No.: US 12,219,738 B2
(45) Date of Patent: Feb. 4, 2025

(54) FLOW RATE SENSING SYSTEM FOR LIQUID COOLANT FLOW MANAGEMENT OF AN IMMERSION COOLING SYSTEM

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 358 days.

(21) Appl. No.: 17/700,342

(22) Filed: Mar. 21, 2022

(65) Prior Publication Data

US 2023/0301027 A1    Sep. 21, 2023

(51) Int. Cl.
*H05K 7/20* (2006.01)

(52) U.S. Cl.
CPC ......... *H05K 7/20381* (2013.01); *H05K 7/203* (2013.01); *H05K 7/20318* (2013.01); *H05K 7/20327* (2013.01); *H05K 7/20818* (2013.01)

(58) Field of Classification Search
CPC ............... H05K 7/20381; H05K 7/203; H05K 7/20318; H05K 7/20327; H05K 7/20818
USPC ........................................................ 165/80.4
See application file for complete search history.

(56) References Cited

U.S. PATENT DOCUMENTS

| | | | | |
|---|---|---|---|---|
| 5,458,185 A | * | 10/1995 | Mizuno | H05K 7/20281 165/286 |
| 6,182,742 B1 | * | 2/2001 | Takahashi | H05K 7/20281 165/200 |
| 10,750,637 B1 | * | 8/2020 | Alissa | H05K 7/20818 |
| 2020/0214173 A1 | * | 7/2020 | Sato | H05K 7/20327 |
| 2020/0383237 A1 | * | 12/2020 | Hashimoto | H05K 7/20272 |
| 2021/0084796 A1 | * | 3/2021 | Gao | H05K 7/20818 |
| 2022/0418148 A1 | * | 12/2022 | Gao | H05K 7/203 |

* cited by examiner

Primary Examiner — Tho V Duong
(74) *Attorney, Agent, or Firm* — WOMBLE BOND DICKINSON (US) LLP (57) ABSTRACT

According to one embodiment, a sensing system for an immersion cooling system that includes several flow sensors that are coupled to several lines that are coupled together and are arranged to sense flow rates of coolant flowing through their respective lines. The sensing system also includes a controller that is communicatively coupled to the flow sensors and is configured to receive sensor data from the sensors. The first line couples to a first pump that moves liquid coolant into an information technology (IT) enclosure, a second line couples to a second pump that moves coolant drawn from the enclosure into the second line, and the third line couples to a third pump that moves coolant drawn from a coolant source into the third line, the coolant drawn from the first lime is a combination of coolant from at least one of the second and third lines.

13 Claims, 7 Drawing Sheets

FLOW RATE SENSING SYSTEM FOR LIQUID COOLANT FLOW MANAGEMENT OF AN IMMERSION COOLING SYSTEM

FIELD

Embodiments of the present disclosure relate generally to an immersion cooling system that includes a sensing system that manages flow rates of liquid coolant that is circulating through the immersion cooling system.

BACKGROUND

Thermal management for a data center that includes several active electronic racks is critical to ensure proper performance of servers and other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit. One common cooling unit is a computer room air conditioning (CRAC) unit that is a device that intakes hot exhaust return air and supplies cooling air to maintain a data center's thermal environment.

Recently, data centers have been deploying more high-power density electronic racks, where more high-density chips are packaged closer together to provide more processing power. Cooling these high-density racks by maintaining a proper thermal environment may be an issue with existing cooling systems, such as a CRAC unit. For instance, although the CRAC unit may maintain the thermal environment with more conventional (or lower-density) racks, the unit may, be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks.

Immersion cooling, on the other hand, which involves at least partially submerging electronics in a dielectric solution is a feasible solution for high-density electronics. Immersion cooling may be implemented through a single-phase immersion system or a two-phase immersion system, where in both cases heat from the high-density electronics is transferred into cooling fluid in which it is submerged. In the one-phase system, liquid coolant circulates through an immersion tank, drawing fluid that is warmed by the electronics out of the tank and supplying cooled fluid back into the tank. For a two-phase immersion solution, vapor is produced by heat generated by the electronics transferring into two-phase fluid, where the vapor is condensed (e.g., by a heat exchanger), and then returned back into the tank. Existing immersion cooling systems provide either single-phase or two-phase cooling solutions. Therefore, there is a need for an immersion cooling system that allows interchangeability between different phase cooling solutions.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment of this disclosure are not necessarily to the same embodiment, and they mean at least one. Also, in the interest of conciseness and reducing the total number of figures, a given figure may be used to illustrate the features of more than one embodiment, and not all elements in the figure may be required for a given embodiment.

DETAILED DESCRIPTION

Several embodiments of the disclosure with reference to the appended drawings are now explained. Whenever the shapes, relative positions and other embodiments of the parts described in a given embodiment are not explicitly defined, the scope of the disclosure here is not limited only to the parts shown, which are meant merely for the purpose of illustration. Also, while numerous details are set forth, it is understood that some embodiments may be practiced without these details. In other instances, well-known circuits, structures, and techniques have not been shown in detail so as not to Obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of interchanging an immersion cooling system between different phase cooling solutions. Specifically, the present disclosure describes a sensing system for an immersion cooling system that manages flow rate of liquid coolant flowing through an immersion cooling system to provide interchangeability between different cooling solutions. The sensing system includes four lines (or tubes) that are fluidly coupled together at an intersection point. In addition, the system includes four flow sensors, where each sensor is coupled to a different line and is for sensing a flow rate of liquid coolant flowing through its respective line as sensor data. The system also includes a controller that is coupled to each of the sensors and is for receiving the sensor data. As described herein, the system allows an immersion cooling system (e.g., that includes an information technology (Iii) enclosure with one or more electronics boards on which one or more IT components, such as processors, are mounted) to have configurable immersion cooling solution based on being in one of several configurations with one or more pumps, a condenser, a coolant source, and one or more IT enclosures to create a heat-exchanging loop to cool one or more IT components of at least one electronics board within the IT enclosure. By being configurable, the immersion cooling system with the sensing system may accommodate different types of coolant (e.g., a single-phase coolant while the system is in a single-phase configuration and a two-phase coolant while the system is in a two-phase configuration). In addition, the sensing system allows expandability and interoperability, is compatible with existing data center fluid systems, allows efficient control and management of immersion cooling, and allows for ease of implementation.

According to one embodiment, a sensing system for an immersion cooling system, the sensing system comprising: a first flow sensor to sense a flow rate of liquid coolant flowing through a first having a first pump to push liquid coolant into an information technology (IT) enclosure that includes at least one electronics board; a second flow sensor to sense a flow rate of liquid coolant flowing through a second line having a second pump for receiving liquid coolant from the IT enclosure; a third flow sensor to sense a flow rate of liquid coolant flowing through a third line having a third pump to receive liquid coolant from a coolant source, wherein the liquid coolant drawn from the first line is received from at least one of the second line and the third line, wherein the first; second, and third lines are fluidly coupled together at an intersection such that the liquid coolant can flow between the first, second, and third lines; and a controller to receive sensor data from each of the first, second, and third flow sensors and to control pump speeds of at least one of the first; second, and third pumps based on the sensor data.

In one embodiment, the sensing system further comprises a port that is coupled to the second line and is arranged to allow liquid coolant that is pushed into the second line by the second pump to be expelled out of the sensing system. In another embodiment, the controller is configured to, while the first line is coupled to the first pump, the second line is coupled to the second pump, and the third line is coupled to the third pump, determine a desired flow rate of liquid coolant to be supplied by the sensing system into the IT enclosure through the first line based on an IT load of one or more IT components of the at least one electronics board, and use the sensor data to control the pump speeds of at least one of the first, second, and third pumps such that 1) liquid coolant is supplied through the first lune at the desired flow rate and 2) the flow rate of liquid coolant flowing through the second line and out of the port at a flow rate and the flow rate of liquid coolant flowing through the third line are both equal to the desired flow rate.

In one embodiment, the sensing system further comprising a fourth flow to sense a flow rate of liquid coolant flowing through a fourth line that is coupled to the first second, and third lines at the intersection, the fourth line is coupled to a condenser that is arranged to receive vapor produced by the IT enclosure and condense the vapor into liquid coolant that is received by the fourth line. In another embodiment, the controller is further configured to determine a desired flow rate of liquid coolant to be supplied by the sensing system into the IT enclosure through the first line based on an IT load of one or more electronics components of the at least one electronics board, and use at least a portion of the sensor data to control pump speeds of at least one of the first and fourth pumps such that liquid coolant is supplied through the first line at the desired flow rate and a flow rate of liquid coolant flowing through the fourth line from the condenser is equal to the desired flow rate.

In some embodiments, the controller is configured to: use at least a portion of the sensor data to control pump speeds of at least one of the first, third, and fourth pumps such that the desired flow rate is equal to a combination of the flow rate of liquid coolant flowing through the third line and the flow rate of liquid coolant flowing through the fourth line. In one embodiment, the controller is configured to use the received sensor data to control pump speeds of at least one of the first, second, third, and fourth pumps such that a combination of flow rates of liquid coolant flowing through the second, third, and fourth lines is equal to the desired flow rate of liquid coolant flowing through the first line.

In one embodiment, the sensing system further comprises a housing in which the sensors, the lines, and the controller are integrated therein.

According to one embodiment, an immersion cooling system, comprising: a sensing system that includes a first flow sensor that is coupled to a first line, a second flow sensor that is coupled to a second line, a third flow sensor that is coupled to a third line, and a fourth flow sensor that is coupled to a fourth line, the flow sensors are arranged to sense flow rates of liquid coolant flowing through their respective line as sensor data, and each of the lines are coupled together at an intersection; and a controller that is electrically coupled to all of the flow sensors and is configured to receive the sensor data from each of the flow sensors; an information technology (IT) enclosure that comprises at least one electronics board that has one or more information technology (IT) components and is at least partially submerged in liquid coolant, the IT enclosure is coupled to the first line; a first pump that is coupled to the first line and disposed between the IT enclosure and the sensing system; and a second pump, wherein the second pump and the sensing system are in a configuration with the IT enclosure to create a heat-exchanging loop to cool the one or more IT components of the at least one electronics board, wherein the controller is electrically coupled to the first and second pumps and is configured to control pump speeds of at least one of the first and second pumps based on the received sensor data.

In one embodiment, the configuration includes the second line of the sensing system being coupled to the IT enclosure and the second pump being coupled to the second line and disposed between the IT enclosure and the sensing system to create the heat-exchanging loop in which liquid coolant flowing through the first line is pushed by the first pump into the IT enclosure and warmed liquid coolant from the IT enclosure is drawn from the IT enclosure by the second pump and into the second line of the sensing system. In another embodiment, the sensing system further comprises a port that is coupled to the second line and is arranged to allow the warmed liquid coolant that is drawn by the second pump to be expelled out of the sensing system. In some embodiments, the immersion cooling system further comprises a third pump that is coupled to the third line and is disposed between a coolant source and the sensing system, wherein the controller is electrically coupled to the third pump and is configured to determine a desired flow rate of liquid coolant to be supplied by the sensing system into the IT enclosure through the first line based on an IT load of the one or more IT components of the at least one electronics board, and use the received sensor data to control pump speeds of the first, second, and third pumps such that liquid coolant is supplied through the first line at the desired flow rate, liquid coolant flows through the second line and out of the port at a flow rate, and liquid coolant flows from the coolant source through the third line at the flow rate, wherein the flow rate is equal to the desired flow rate.

In one embodiment, the immersion cooling system further comprises a condenser, wherein the configuration includes the IT enclosure being coupled to a vapor inlet of the condenser, the second line being coupled to a liquid coolant outlet of the condenser, and the second pump being coupled to a cooling inlet of the condenser to create the heat-exchanging loop in which 1) liquid coolant pushed by the first pump into the IT enclosure turns into vapor that is received by the condenser and 2) liquid coolant condensed from the vapor by the condenser according to a pump speed of the second pump is received into the second line of the sensing system.

In one embodiment, the controller is configured to determine a desired flow rate of liquid coolant to be supplied by the sensing system into the IT enclosure through the second line based on an IT load of the one or more IT components, and use the received sensor data to control pump speeds of the first and second pumps such that liquid coolant is supplied through the first line at the desired flow rate, liquid coolant flows through the second line at a flow rate that is equal to the desired flow rate. In another embodiment, the flow rate is a first flow rate, wherein the immersion cooling system further comprises a third pump that is coupled to the third line and is disposed between a coolant source and the sensing system; and a fourth pump that is coupled to the fourth line and is disposed between the sensing system and the IT enclosure, wherein the controller is configured to use the received sensor data to control pump speeds of the first, second, third, and fourth pumps such that the desired flow rate is equal to a combination of the first flow rate, a second flow rate of liquid coolant flowing through the third line, and a third flow rate of liquid coolant flowing through the fourth line.

According to one embodiment, a method performed by a sensing system, the method comprising: determining an information technology (IT) load of one or more IT components of an electronics board that is at least partially submerged within an IT enclosure, the sensing system comprising a first line, a second line, and a third line that are coupled together at an intersection, the first line comprising a first flow sensor, the second line comprising a second flow sensor, and the third line comprising a third flow sensor; determining a first desired flow rate of liquid coolant that is to be supplied by the sensing system, through the first line that is coupled to an inlet of the IT enclosure based on the IT load; while the sensing system is in a first configuration in which the second line is coupled to an outlet of the IT enclosure and the third line is coupled to a coolant source, and based on sensor data from at least one of the flow sensors, drawing liquid coolant from the coolant source and through the third line at a second desired flow rate; drawing liquid coolant from the IT enclosure and through the second line at a third desired flow rate; and supplying at least a portion of the drawn liquid coolant at the first desired flow rate into the IT enclosure.

In one embodiment, the sensing system further comprises a port that is coupled to the second line and is arranged to allow liquid coolant drawn from the IT enclosure to be expelled out of the sensing system, wherein the supplied liquid coolant into the IT enclosure is from the coolant source with the second and third desired flow rates being equal to the first desired flow rate. In another embodiment, drawing liquid coolant from the coolant source comprises determining a pump speed at which a pump coupled to the third line such that liquid coolant flows through the third line at the second desired flow rate; and setting the pump to the pump speed.

In one embodiment, the method further comprises, while the sensing system is in a second configuration in which 1) a vapor inlet of a condenser is coupled to a vapor outlet of the IT enclosure, 2) the second line is coupled to a liquid coolant outlet of the condenser and 3) a pump couples the condenser to a cooling source, and based on sensor data from at least one of the flow sensors, setting the pump at a pump speed such that the second line receives liquid coolant condensed by the condenser at a second desired flow rate; drawing liquid coolant from the coolant source at a third desired flow rate; and supplying the liquid coolant at the first desired flow rate, which is a combination of the second and third desired flow rates.

In one embodiment, the method further comprises, while the sensing system is in a third configuration in which 1) the second line is coupled to an outlet of the IT enclosure. 2) the third line is coupled to a coolant source, 3) a vapor inlet of a condenser is coupled to a vapor outlet of the IT enclosure, 4) the fourth line is coupled to a liquid coolant outlet of the condenser, and 5) a pump couples the condenser to a cooling source, and based on sensor data from at least one flow sensor, drawing liquid coolant from the outlet of the IT enclosure at a second desired flow rate; drawing liquid coolant from the coolant source at a third desired flow rate; setting the pump at a pump speed such that the fourth line receives liquid coolant condensed by the condenser from vapor received by the condenser from the IT enclosure at a fourth desired flow rate; and supplying the liquid coolant at the first desired flow rate, which is a combination of the second, third, and fourth desired flow rates.

In one embodiment, as used herein, "to couple" one component (or element) to another component may refer to "fluidly" coupling the two components so that a fluid (or liquid), such as a cooling liquid or a liquid coolant may flow between the two components. For example, coupling a first tube to a second tube may couple both tubes together such that liquid coolant may flow from the first tube into the second tube (and/or vice a versa).

Figure 1:
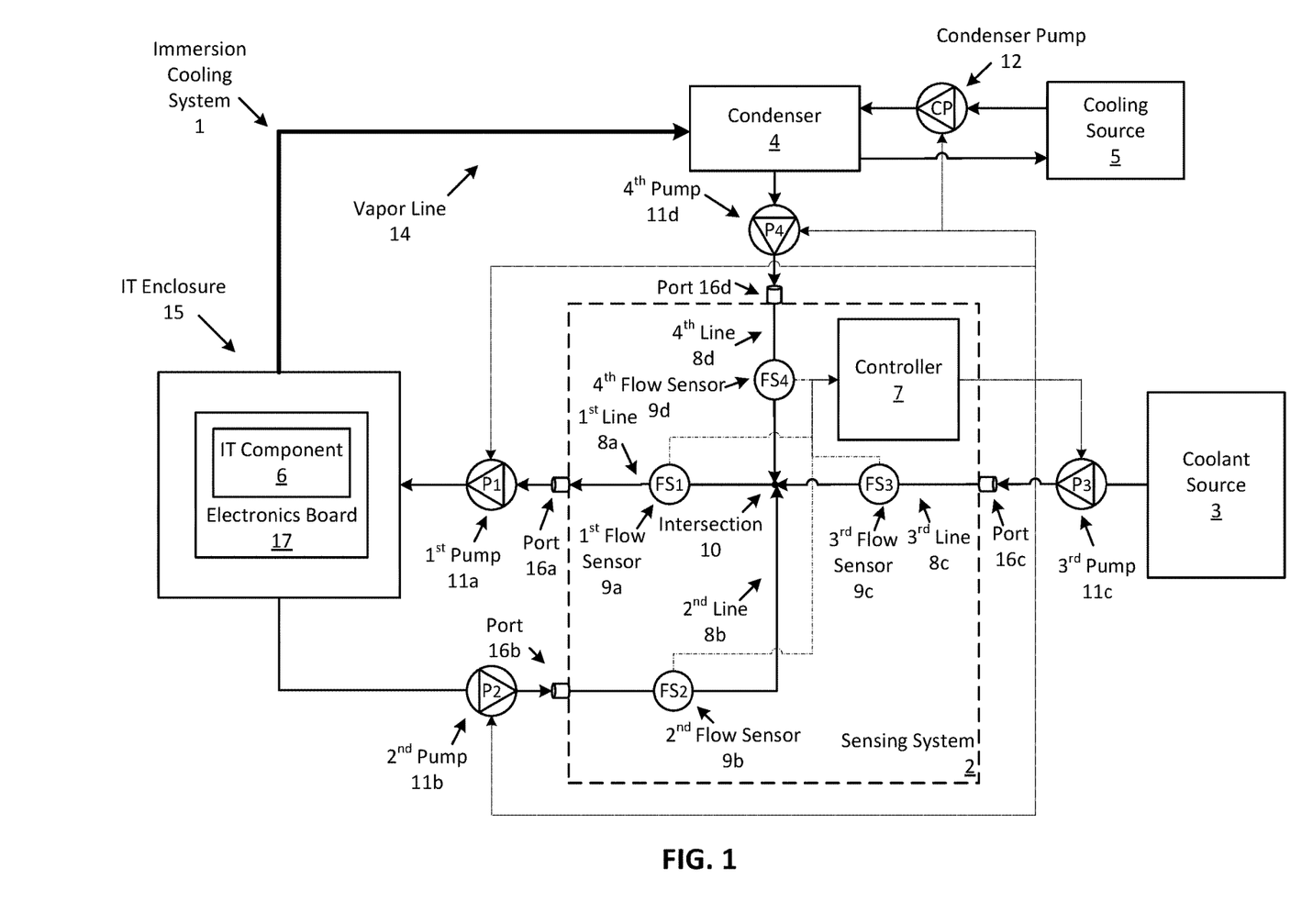
FIG. 1 shows an example of an immersion cooling system with a sensing system according to one embodiment.

FIG. 1 shows an example of an immersion cooling system 1 with a flow rate sensing system (herein referred to as "sensing system") 2 according to one embodiment. Specifically, this figure shows a sensing system that is configured to support different immersion cooling configurations for the immersion cooling system. As illustrated, the cooling system 1 includes a sensing system 2, a coolant source 3, a condenser 4, a cooling source 5, an information technology (IT) enclosure 15, four liquid pumps ($P_1$-$P_4$) 11a-11d, and a condenser pump (CP) 12 (which may be a liquid pump that is similar to the four liquid pumps). In one embodiment, the system may include more or less elements as described herein. For example, the cooling system may include one or more IT enclosures and may include more pumps. As another example, the cooling system may include less elements, such as not including a condenser, condenser pump, and cooling source.

The IT enclosure 15 comprises an electronics board and an IT component 6, which are at least partially submerged in liquid coolant. In one embodiment, the IT enclosure may include one or more electronics boards, each with one or more IT components. In some embodiments, the IT enclosure may be a coolant tank, which is formed from any type of material (e.g., plastic, metal, etc.), and is configured to hold one or more electronics boards, each having one or more IT components. In one embodiment, the IT enclosure may be any shape and may be configured to immersion cool the electronics board through one or more immersion cooling configurations. More about the configurations is described herein.

As shown, the electronics board 4 includes an IT component 6 (e.g., which may be mounted on the board). In some embodiments, the board may include one or more IT components (e.g., central processing units or CPUs, graphical processing units (GPUs), memory, and/or storage devices). The IT component may perform data processing tasks, where the IT component may include software installed in a storage device, loaded into the memory, and executed by one or more processors to perform the data processing tasks. In one embodiment, the electronics board may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more (GPUs) managed by the host server. The performance compute servers (e.g., the IT component) perform the actual tasks, which may generate heat during the operations. This heat, as described herein needs to be transferred away from the component in order to ensure that it does not overheat, which may result in failure. Thus, while the board provides the IT services, the (e.g., IT components of the) board generates heat that is transferred into the liquid coolant. More about this process is described herein.

The condenser 4 is a two-phase liquid-to-liquid heat exchanger that is configured to condense vapor into a cooled (condensed) liquid coolant. As described herein, the condenser is coupled to the IT enclosure via a vapor line 14, which provides the vapor that may be produced by heat produced by the IT components that are submerged within liquid coolant inside the IT enclosure. The condenser 4 is coupled to an external cooling source 5, via supply and return (liquid) lines to create a (e.g., primary) heat exchanging loop. Specifically, the cooling source is configured to supply cooling liquid to the condenser, via a supply line, while the condenser returns cooling liquid that is warmed by vapor circulating through the condenser that is received via the vapor line 14, via a return line, back to the cooling source 5.

The condenser pump 12, CP, is coupled to and disposed between the condenser 4 and the cooling source 5. In particular, CP is coupled to the supply liquid line that fluidly couples the condenser to the cooling source. In one embodiment, the CP may be coupled to the return line. In some embodiments, CP is arranged push (or move) cooling liquid that is drawn from the cooling source into the condenser in order to circulate the cooling liquid through the primary heat exchanging loop. In some embodiments, a pump speed of the CP may be adjusted (e.g., by a controller, such as controller 7 of the sensing system 2) in order to adjust the flow rate of cooling liquid flowing through the primary heat exchanging loop. Specifically, an adjustment of the flow rate may increase (or decrease) heat transfer between vapor that is received into the condenser and the cooling liquid. For example, an increase (e.g., above a threshold) of the flow rate may increase a heat transfer rate, which may cause the condenser to produce more condensate (condensed liquid coolant) from received vapor. More about adjusting the flow rate according to the pump speed of the CP is described herein.

In one embodiment, the condenser may comprise condenser coils that are designed to transfer heat of vapor flowing through the coils into liquid coolant that comes into contact with the coils. In which case, the condenser may output liquid coolant that is condensed from the vapor. In another aspect, the condenser may include a reservoir that is arranged to store condensed liquid coolant.

In one embodiment, the cooling source 5 may be any source that is configured to draw heat from the cooling liquid that circulates through the primary heat exchanging loop. For example, the source 5 may be a data center cooling water system or an IT liquid cooling water system, or any type of cooling fluid source. As another example, the source 5 may include a liquid distribution manifold (not shown) that couples a heat exchanging source with one or more other IT cooling systems.

In one embodiment, the condenser is configured to condense vapor received from the IT enclosure. For example, during operation of the IT component 6 heat generated by the component (and/or electronics board) that causes at least some of the liquid coolant within the IT enclosure to turn into (e.g., phase change into) vapor coolant. The vapor is transferred to the condenser via the vapor line 14, which condenses the vapor into liquid coolant by transferring heat from the vapor into the cooling liquid that is circulating within the primary heat exchanging loop. More about this two-phase immersion cooling solution is described herein.

In one embodiment, the coolant source 3 may be a source that is configured to supply (cool) liquid coolant. For example, the coolant source may be similar (or the same) type of source as the cooling source 5. More about the coolant source is described herein.

The sensing system 2 is configured to control and manage two-phase liquid coolant for immersion cooling the immersion cooling system in one or more immersion cooling configurations using one or more flow rate sensors disposed therein. Specifically, the system 2 includes four (liquid) lines 8a-8d, four flow sensors 9a-9d, and a controller 7. In one embodiment, the system may include more or less elements, such as having more or less lines and/or sensors. In one embodiment, the sensing system may comprise an enclosure or housing in which the elements of the sensing system (e.g., the lines, sensors, anchor the controller) are contained (or integated) therein.

In one embodiment, the four lines 8a-8d may be tubes or pipes that are designed to carry fluid (e.g., liquid coolant and/or vapor). In some embodiments, the lines may be composed of any type of material (e.g., metal, etc.). In another embodiment, the lines may be rigid pipes or flexible tubes. As shown, the four lines 8a-8d are fluidly coupled together at an intersection 10 such that liquid coolant may flow between (at least some of) the lines. For example, as shown, liquid coolant may flow into the first line 8a from at least one of the second, third, and fourth lines 8b-8d. In one embodiment, the intersection may be a fitting, such as a cross fitting that has four openings that are arranged to be coupled to each of the lines. In addition, each of the lines 8a-8d is coupled to a respective one of ports 16a-16d, in one embodiment, each of the ports may include a connector; such as a dripless blind mating quick disconnect that is configured to couple to another line.

Each of the lines 8a-8d includes a respective at least one flow sensor. For example, a first flow sensor 9a ($FS_1$) is coupled to the first line 8a, a second flow sensor 9b ($FS_2$) is coupled to the second line 8b, a third flow sensor 9c ($FS_3$) is coupled to the third line 8c, and a fourth flow sensor 9d ($FS_1$) is coupled to the fourth line 8d. In one embodiment, the flow sensors are coupled to their respective lines such that liquid coolant that flows through a line also flows through its respective flow sensor. In one embodiment, each flow sensor is configured to measure (or sense) a flow rate of fluid (e.g., liquid coolant) flowing through its respective line, and produce sensor data that indicates the flow rate. In one embodiment, each of the flow sensors may be any type of sensor that is configured to measure the flow rate of liquid. For example, the sensors may be contact or non-contact sensors. In one embodiment, the flow sensors are used by the sensing system to control flow rate of liquid coolant flowing through one or more lines of the system, Specifically, each flow rate sensor may be used to control flow rate of liquid coolant flowing through its respective line (and/or one or more other lines within the system). More about using the sensors to control flow rate is described herein.

Also illustrated, each of the lines 8a-8d are coupled to one or more elements of the immersion cooling system via one or more liquid pumps. For instance, a first pump 11a, $P_1$, is coupled to and disposed between the first line 8a and the IT enclosure, a second pump 11b, $P_2$, is coupled to and disposed between the second line 8b and the IT enclosure, the third pump 11c, $P_3$, is coupled to and disposed between the third line 8c and the coolant source 3, and the fourth pump 11d, $P_4$, is coupled to and disposed between the fourth line 8d and the condenser 4. Specifically, each of the lines 8a-8d are coupled to their respective pumps 11a-11d, via ports 16a-16d. As described herein, each of the pumps are arranged to either push liquid coolant into their respective lines (e.g., $P_2$-$P_4$) or push liquid coolant drawn from their respective line (e.g., $P_1$). More about the liquid pumps is describe herein.

In one embodiment, one or more of the lines may be coupled to elements of the immersion cooling system without one or more liquid pumps disposed between. For instance, the fourth line 8d may be coupled (e.g., directly) connected) to the condenser 4. In which case, there immersion cooling system may not include $P_4$. As another example, the third line Sc may be coupled (e.g., directly) to the coolant source 3.

The controller 7 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The controller may also include memory. In one embodiment, the controller may be a part (or integrated) into the (e.g., housing of the) sensing system, as described herein. In another embodiment, it may be separate. For instance, the controller may be an electronics device that is disposed within the IT enclosure 15 and is immersion cooled, as described herein.

In one embodiment, the controller 7 is communicatively (or electrically) coupled (e.g., wired and/or wirelessly connected) to at least some of the components of the immersion cooling system 1. Specifically, the controller is communicatively coupled to all of the flow sensors 9a-9d of the sensing system, and is configured to receive sensor data (e.g., that indicates a flow rate of liquid coolant) from each of the flow sensors. In some embodiments, the controller may be communicatively coupled to one or more liquid pumps. In particular, as shown, the controller 7 is communicatively coupled with the four liquid pumps 11a-11d and with the condenser pump 12, and is configured to control pump speeds of at least one of the pumps based on received sensor data, as described herein. For instance, the controller is configured to transmit a control signal (e.g., to electronics of) to a pump in order to activate the pump (e.g., cause the pump to draw liquid coolant and push the drawn liquid coolant and to deactivate the pump (e.g., cause the pump to stop drawing and pushing liquid coolant). The controller may also adjust a pump speed of the pump in order to adjust a flow rate at which liquid coolant is pushed by the pump.

The controller 7 is configured to manage flow rates of liquid coolant flowing throuh one or more of the sensing system's lines 8a-8d. Specifically, the controller manages the flow rates by controlling one or more of the liquid pumps 11a-11d and/or 12 based on sensor data of one or more of the flow sensors 9a-9d according to a (current) IT workload (or IT load) of (one or more IT components mounted on) one or more electronics boards that are active (e.g., performing computational tasks) within the IT enclosure(s) 15 and according to a configuration of the immersion cooling system. For example, the controller determines a configuration (of several configurations) of the immersion cooling system, such as a single-phase immersion cooling configuration in which two lines are coupled to the IT enclosure, where one line is to supply cooled liquid coolant into the IT enclosure and another line is for drawing warmed liquid coolant out of the IT enclosure. In addition, at least some pumps may be disposed to circulate coolant through the system. The controller is configured to determine an IT load of the electronics board (e.g., based on data received from the board). From this data, the controller determines a flow rate of liquid coolant through the system that is required to adequately cool the pieces of equipment. The controller is configured to set pump speeds of one or more pumps coupled to the system in order to manage flow rates through one or more lines based on the IT load of the IT enclosure. As a result, the sensing system provides configurability and interchangeability between different immersion cooling solutions. More about the controller managing flow rates is described herein.

In one embodiment, the sensing system may be configured to removably couple to one or more of the components described herein in order to allow interchangeability between several immersion cooling configurations. In particular, the sensing system may be removably coupled to one or more of the pumps 11a-11d and may be removably coupled to other components, such as the condenser 4, the IT enclosure 15, and the coolant source 3. For example, one or more of the lines 8a-8d (e.g., via the ports 16a-16d) may removably couple to the pumps 11a-11d, as shown in this figure. In particular, the first line 8a is arranged to couple to the first pump 11a, which is configured to push liquid coolant drawn from the first line into the IT enclosure; the second line 8*b* is arranged to couple to the second pump 11*b* that is arranged to push liquid coolant drawn from the IT enclosure into the sensing system; the third line 8*c* is arranged to couple to the third pump 11*c* that is arranged to push liquid coolant drawn from the coolant source 3 into the (third line of the) sensing system; and the fourth line 8*d* is arranged to couple to the fourth pump 11*d* that is arranged to push liquid coolant drawn from the condenser 4 into the (fourth line of the) sensing system. As shown in this figure, specific lines are coupled to specific pumps, such as the first line Sa being coupled to the first pump 11*a*. In one embodiment, the sensing system may be rearranged, such that different lines may couple to different pumps. For instance, the third line Se may be coupled to the first pump 11*a*.

Figure 2:
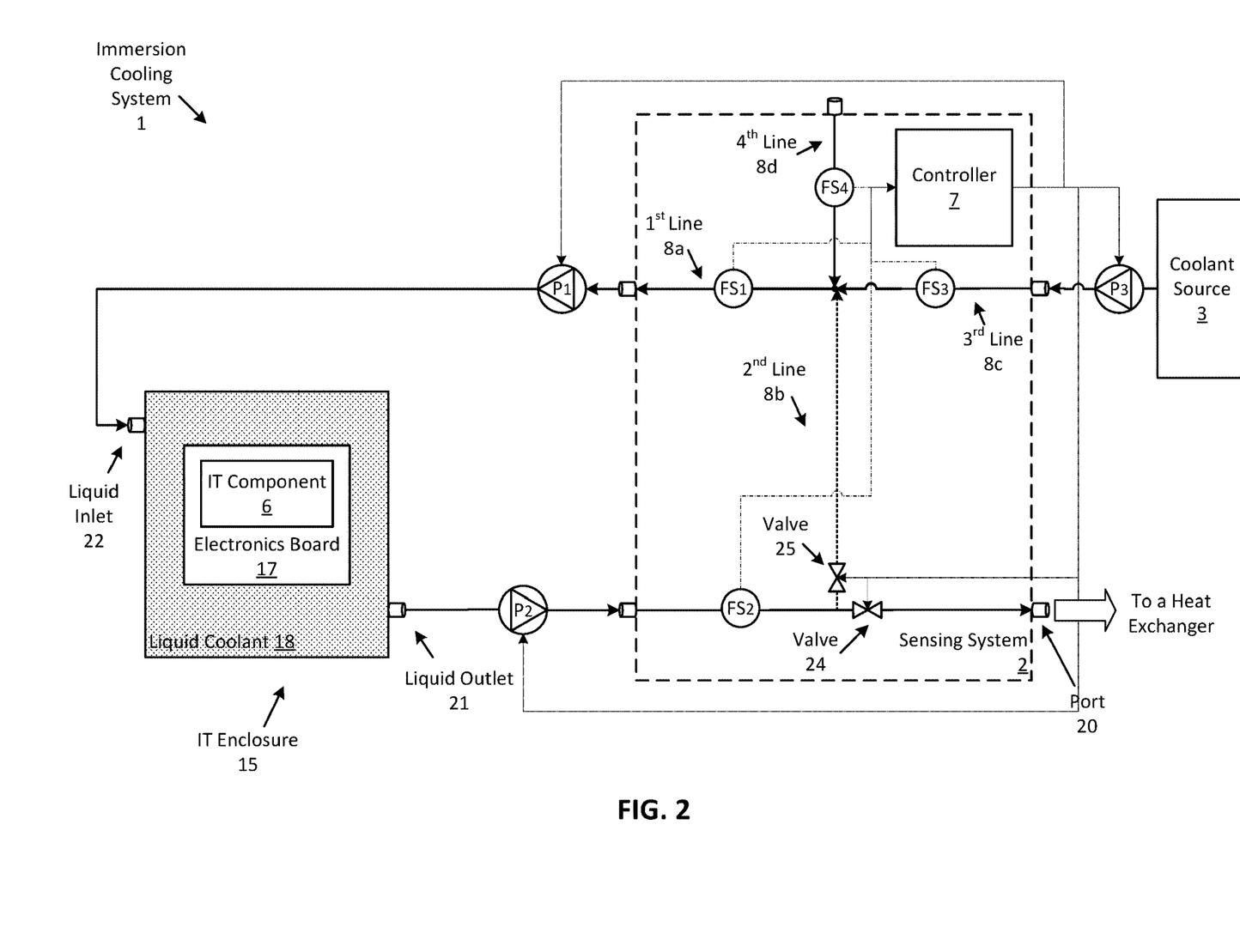
FIG. 2 shows an example of the immersion cooling system that, is in a first configuration that is using the sensing system to implement single-phase immersion cooling according to one embodiment.
Figure 3:
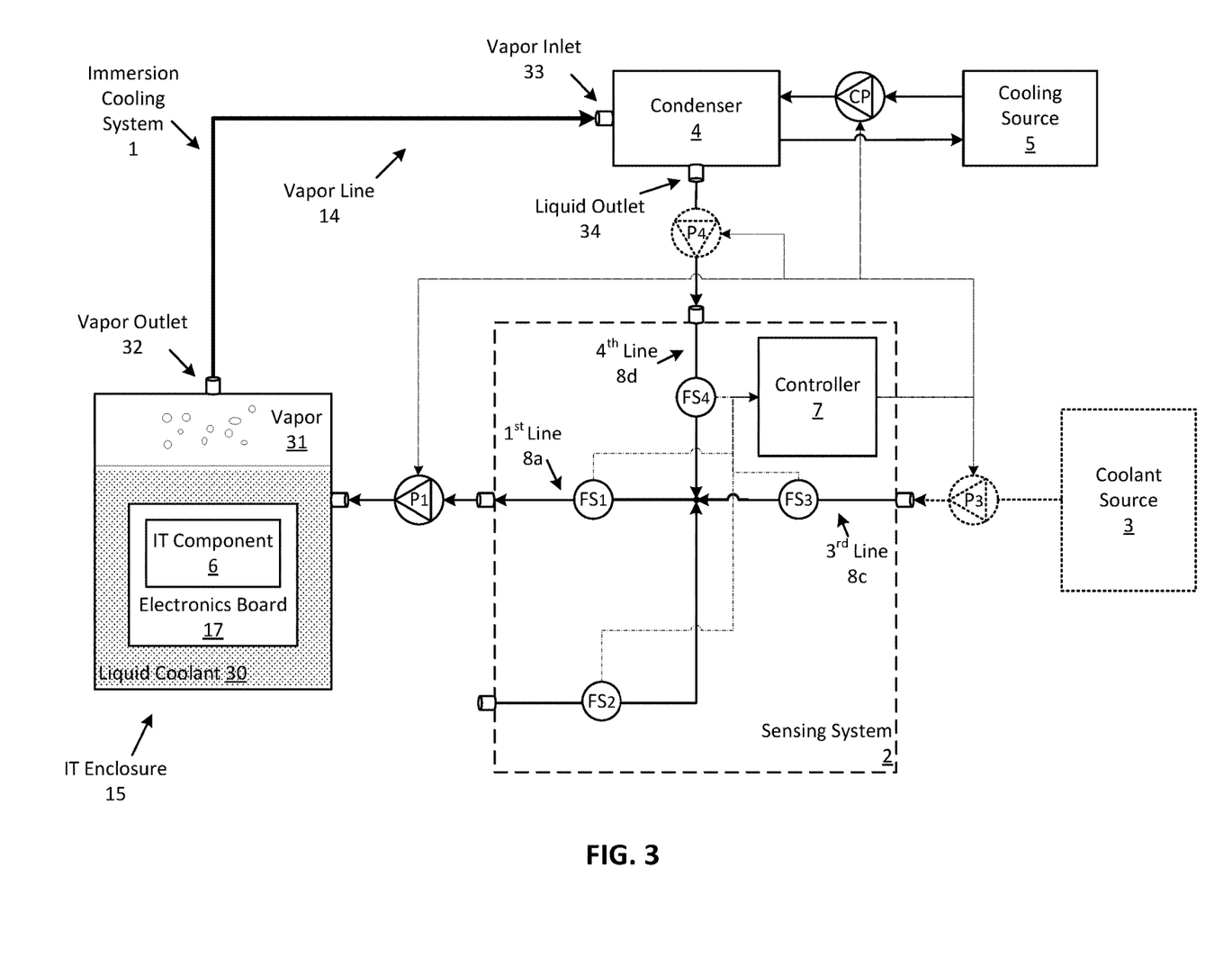
FIG. 3 shows an example of the immersion cooling system that is in a second configuration that is using the sensing system to implement two-phase immersion cooling according to one embodiment.
Figure 4:
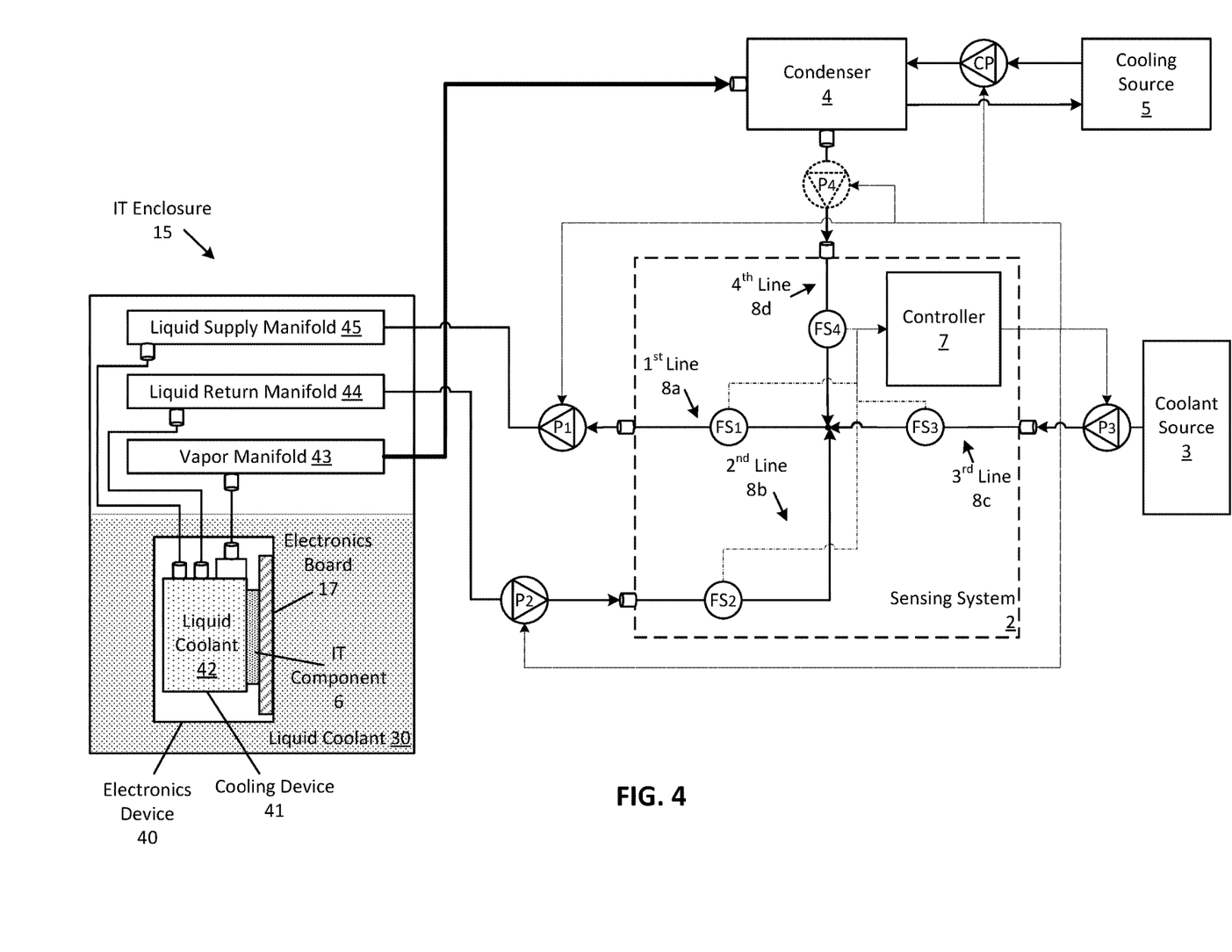
FIG. 4 shows an example of the immersion cooling system that is in a third configuration that is using the sensing system to implement active two-phase cooling according to one embodiment.

As described herein, the immersion cooling system 1 may be in one of several immersion cooling configurations based on how the sensing system 2 is coupled to one or more components of the immersion cooling system. FIGS. 2-4 show three different immersion cooling configurations of the immersion cooling system. In some embodiments, these are only examples and therefore the immersion cooling system may be configured differently. For instance, the system may be configured in a configuration that is a combination of the configurations describe herein.

FIG. 2 shows an example of the immersion cooling system 1 that is in a first (e.g., single-phase immersion cooling) configuration in which the sensing system is used to implement single-phase immersion cooling according to one embodiment. Specifically, this figure is showing that the IT enclosure 15 is being single-phase liquid cooled by the sensing system forming a heat exchanging loop in which liquid coolant is being supplied by the coolant source, while warmed liquid coolant is being drawn from the IT enclosure. As shown, the electronics board 4 is (at least partially) submerged within liquid coolant 18, where the liquid coolant is circulated through the immersion cooling system. In one embodiment, the liquid coolant may be any type of single-phase liquid coolant.

In this figure, the sensing system is coupled to the coolant source 3 and the IT enclosure. Specifically, the third line 8*c* is coupled to $P_3$, which is coupled to the coolant source 3, the first line 8*a* is coupled to $P_1$, which is coupled to the IT enclosure via a liquid inlet 22. The second line 8*b* is coupled to $P_2$, which is also coupled to the IT enclosure 15 via a liquid outlet 21. In one embodiment, the liquid inlet 22 may be positioned higher (e.g., along a vertical axis) than the liquid outlet, such that liquid may flow into the IT enclosure at a point that is higher than where the liquid coolant 18 is being drawn out of the IT enclosure, via the outlet.

The sensing system 2 includes one or more additional components. For example, the system 2 includes a port 20 that is coupled to the second line 8*b* and is arranged to allow liquid coolant that is pushed into the second line by $P_2$ to be expelled out of the sensing system 1. More about port 20 is described herein. In addition, the sensing system also includes valves 24 and 25 that are coupled to the second 8*b*, where valve 24 is disposed between and coupled in series with $FS_2$ and port 20, and valve 25 is disposed between and coupled in parallel with $FS_2$ and valve 24. In one embodiment, the sensing system may include less or more valves, such as only having valve 25. In this example, the valve 25 is closed, while valve 24 is open. In another embodiment, the valves may be configured differently based on the immersion cooling configuration of the system. For example, while in the two-phase immersion cooling configuration (e.g., shown in FIG. 3), valve 24 may be closed, while valve 25 may be open. Each of these valves are communicatively coupled with controller 7, and are configured to open/close based on control signals received from the controller 7.

This configuration allows the immersion cooling system to create a single-phase immersion cooling (heat exchanging) loop. For example, $P_3$ draws liquid coolant 18 from the coolant source and pushes the drawn liquid coolant into the third line Sc and therefore into the first line 8*a*, via the intersection 10). $P_1$ draws liquid coolant from the first line (which is from the third line 8*c*) and provides the coolant into the IT enclosure. $P_2$ draws (warmed) liquid coolant out of the IT enclosure and pushes the warmed liquid coolant into the second line 8*b*, where the coolant is expelled through port 20. In one embodiment, the port 20 may be coupled to a heat exchanger, that is arranged to cool the warmed liquid coolant and then supply the cooled coolant back into the coolant source 3. In another embodiment, the port may couple (e.g., directly) to the coolant source 3, which may include one or more heat exchangers, as described herein.

In this single-phase immersion cooling configuration, the controller 7 is configured to manage flow rates of liquid coolant flowing through the sensing system based on a desired flow rate of liquid coolant being supplied into the IT enclosure 15. Specifically, the controller is configured to determine a desired flow rate of liquid coolant that is to flow through the first line 8*a* (e.g., $Rate_{DesiredLine1}$) based on one or more parameters of the IT enclosure. For example, the controller may be configured to determine an IT load of the IT component 6 of the electronics board 4 that is submerged within the IT enclosure. The controller may determine the IT load based on data received from the IT enclosure that indicates the computational tasks (or operations) being performed by the IT component 6. In another embodiment, the IT load may be computed by the (IT component of the) electronics board, and may be transmitted (e.g., via a communication data link) to the controller. From the IT load, the controller may determine $Rate_{DesiredLine1}$, where this desired flow rate may be designed to efficiently cool the component (which is producing heat due to the IT load) within the IT enclosure (e.g., to remain below a threshold temperature). Thus, the controller determines the desired flow rate based on the IT load such that heat produced by the IT component, as a result of performing the IT load, is removed such that a temperature of the IT component may remain below the threshold temperature (which may be a predefined threshold).

In another embodiment, the $Rate_{DesiredLine1}$ may be determined based on other parameters. For example, the controller may determine the rate based on a (e.g., current) IT temperature of the IT component and a desired cooling temperature. In particular, when the current IT temperature is higher (e.g., a threshold) than the cooling temperature, the controller may increase the $Rate_{DesiredLine1}$ in order to increase cooling capacity of the system. In another embodiment, the $Rate_{DesiredLine1}$ may be determined based on power (e.g., current) that is being drawn by the (e.g., IT component that is operating in the) IT enclosure.

As described thus far, the $Rate_{DesiredLine1}$ may be based on an IT load of the IT component 6 of the electronics board 17. In another embodiment, the rate may be based on one or more IT components 6 mounted on one or more electronics boards. For example, the rate may be based on a cumulative IT load of electronics that are being immersion cooled within the IT enclosure.

With $Rate_{DesiredLine1}$, the controller may be configured to determine desired flow rates through one or more other lines.

Specifically, the controller may determine a desired flow rate through the second line 8b (e.g., $Rate_{DesiredLine2}$) and a desired flow rate through the third lien 8c (e.g., $Rate_{DesiredLine3}$) as being both equal to $Rate_{DesiredLine1}$, such that liquid coolant may flow continuously (and at a same rate) through the sensing system (e.g., flowing at a same rate from the coolant source, into the IT enclosure, and back into and out of the sensing system 2). In one embodiment, by having the liquid coolant flow through the system at a same rate ensures that the IT enclosure does not overflow (which would be the case if a flow rate of liquid coolant within the second line Sb (e.g., $Rate_{Line2}$) were less than a flow rate of liquid coolant flowing through the first line 8a (e.g., $Rate_{Line1}$)) and does not drain (e.g., below a threshold), which would be the case if $Rate_{Line2}>Rate_{Line1}$.

With the desired flow rates, the controller may be configured to use received sensor data from at least one of $FS_1$-$FS_3$ to control the pump speeds of at least one of $P_1$-$P_3$ such that the sensing system achieves the desired flow rates. In particular, the controller configures the pump speeds of one or more of the pumps such that flow rate readings from the flow rate sensors achieve their respective desired rates (e.g., within at least a threshold). For example, the controller may configure $P_3$ such that a measured flow rate of $FS_3$, $Rate_{Line3}$, is equal to (or is within a given range of) $Rate_{DesiredLine3}$. In one embodiment, the controller may dynamically adjust pump speeds of at least some of the pumps in order to achieve similar (or the same) flow rates, such that $Rate_{Line2}=Rate_{Line3}=Rate_{Line1}=Rate_{DesiredLine1}$.

In one embodiment, the controller may adjust pump speeds in order to adjust flow rates based on sensor data from one or more of the flow sensors. For example, upon determining the flow rate at which liquid coolant is to flow through the third line 8c ($Rate_{Line3}$), the controller may be configured to monitor the sensed flow rate of $FS_3$. If the sensed flow rate decreases (e.g., where $Rate_{Line3}<Rate_{DesiredLine3}$ or where $Rate_{Line3}$ is less than $Rate_{DesiredLine3}$ by a threshold), the controller may increase the pump speed of P 3. In another embodiment, the controller may dynamically adjust pump speeds based on changes to other flow rates. For example, upon determining that $Rate_{Line1}>Rate_{DesiredLine1}$, which may mean that too much liquid coolant is being supplied by the coolant source, the controller may decrease the pump speed of $P_3$ (and/or may decrease the pump speed of $P_1$).

In another embodiment, the pump speeds may be adjusted based on changes to one or more desired flow rates within the sensing system 2. For example, while operating, the IT load of the IT enclosure may change (e.g., due to an increase in computational tasks). As a result of performing additional computational tasks, the system may require a higher desired flow rate of liquid coolant flowing throgh the IT enclosure in order to increase heat extraction from the components within the IT enclosure. The controller may then compute a new $Rate_{DesiredLine1}$ (e.g., from a new (increased) IT load), and using the new desired rate, adjust pump speeds of one or more of the liquid pumps based on sensor data (e.g., in order to maintain $Rate_{Line2}=Rate_{Line3}=Rate_{Line1}=Rate_{DesiredLine1}$). In some embodiments, with the new $Rate_{DesiredLine1}$, the controller may compute new desired flow rates through other lines and use those newly determined flow rates to adjust their respective pumps.

As described thus far, the rate at which warmed liquid coolant is expelled through the port 20 may be equal to $Rate_{DesiredLine2}$, due to the valve 25 being closed and valve 24 being open. In another embodiment, the valve 25 may be at least partially open in order to allow at least some warmed liquid coolant that is received into the second line 8b to mix with at least some liquid coolant from the coolant source 3 (e.g., at the intersection 10). In which case, the flow rate within line 1 will increase. As a result of the increase, the controller may be configured to determine $Rate_{Line1}$ of FS' and determine whether $Rate_{Line1}>Rate_{DesiredLine1}$. If so, the controller may be configured to adjust (e.g., reduce) the pump speed of in order to compensate for the additional flow of liquid coolant into the first line, such that the combination of flow rates through the third and second line (flow rate of liquid coolant being circulated back into the first line) remains (approximately) equal to the desired flow rate of the first line.

FIG. 3 shows an example of the immersion cooling system 1 that is in a second (e.g., two-phase immersion cooling) configuration in which the sensing system is used to implement two-phase immersion cooling according to one embodiment. Specifically, the IT enclosure 15 is being two-phase liquid cooled by the sensing system forming a heat exchanging loop between the IT enclosure and the condenser 4. As shown, the electronics board 4 is (at least partially) submerged within liquid coolant 30, where the liquid coolant is supplied by the sensing system into the IT enclosure. In one embodiment, the liquid coolant may be any type of two-phase liquid coolant, in some embodiments, the liquid coolant 30 may be any type of thermally conductive dielectric liquid. In another embodiment, the coolant may be a non-toxic fluid. In some embodiments, the coolant may be designed and operated to have a low boiling point (e.g., below a threshold operating temperature for at least some of the major components of the electronics board that is submerged within the IT enclosure).

This figure is showing that the sensing system 2 is coupled to the IT enclosure, the condenser 4. Specifically, the first line 8a is coupled to P that is coupled to (the liquid inlet of) the IT enclosure and the fourth line 8d is coupled to (a liquid outlet 34 of) the condenser 4. In one embodiment, the sensing system may be coupled to one or more other components. For instance, as shown, the fourth line 8d may be (optionally) coupled to $P_4$ and/or the third line 8c may be (optionally) coupled to $P_3$ that is coupled to the coolant source 3. Also shown, the IT enclosure is coupled to the condenser via the vapor line 14 that couples the (e.g., vapor outlet 32 of the) IT enclosure 15 to (e.g., a vapor inlet 33 of) the condenser 4.

This configuration allows the immersion cooling system 1 to create a two-phase immersion cooling (secondary heat exchanging) loop for immersion cooling the IT component 6 that is at least partially submerged within the liquid coolant 30. For instance, $P_1$ draws liquid coolant 30 from the first line 8a and supplies the liquid coolant into the IT enclosure 15. The IT enclosure produces vapor 31 that is the result of heat transferred from the (IT component 6 of the) electronics board 4 into the liquid coolant 30. The produced vapor travels into the condenser 4, via the vapor line. The condenser condenses the vapor by transferring heat within the vapor into the cooling liquid from the cooling source 5 that being provided by CP. The condensed liquid coolant is received by the fourth line 8d at a particular flow rate and is received into the first line 8a. As a result, the liquid coolant provided to the IT enclosure is the liquid coolant condensed by the condenser 4.

In this two-phase immersion cooling configuration, the controller 7 is communicatively coupled to (at least) $P_1$ and CP, and is configured to manage flow rates of liquid coolant flowing through the sensing system based on a determined $Rate_{DesiredLine1}$ (where $Rate_{DesiredLine1}$ is determined as described herein). With $Rate_{DesiredLine1}$, the controller may be configured to determine desired flow rates of one or more other lines, in this case, the controller may determine a desired flow rate of condensed liquid coolant that is to be received from the condenser, as $Rate_{DesiredLine4}$. In one embodiment, the controller may determine $Rate_{DesiredLine4}$ to equal $Rate_{DesiredLine1}$ in order to draw all liquid coolant that is required to cool the IT enclosure from the condenser.

The controller may be configured to use received sensor data from at least one of $FS_1$ and $FS_4$ to control pump speeds of at least one of $P_1$ and CP such that a flow rate of liquid coolant flowing through the sensing system (e.g., out of the first line 8a and into the fourth line 8d) is equal to the desired rates (e.g., $Rate_{DesiredLine1}=Rate_{DesiredLine4}$). In particular, from $Rate_{DesiredLine4}$, the controller configures a pump speed of CP, in order for the primary heat exchanging loop to draw enough heat away from the vapor received by the condenser such that condensed liquid coolant flows from the condenser and into the sensing system at $Rate_{DesiredLine4}$. Thus, the controller may use sensor data from $FS_4$ that indicates the flow rate of liquid coolant flowing through the fourth line 4, $Rate_{Line4}$, to dynamically control the pump speed of CP in order to achieve the desired flow rate in which $Rate_{Line1}=Rate_{DesiredLine1}=Rate_{DesiredLine4}$.

As shown, $P_4$ may be an optional component. For example, when the condenser is positioned above the sensing system, the liquid coolant may flow (naturally) downward and into the fourth line. In which case, $P_4$ may not be required. In some embodiments, $P_4$ may be used to draw liquid coolant from the condenser (e.g., from a reservoir of the condenser, where condensed liquid coolant may be stored) in order to draw liquid coolant out of the condenser. For example, when the condenser is not positioned above the sensing system (e.g., and may be to the side), $P_4$ may be configured to draw liquid coolant from the condenser and into the sensing system. In which case, the controller may configure $P_4$'s pump speed such that $Rate_{Line4}=Rate_{DesiredLine4}$, as described herein.

In some embodiments, the condenser may not condense enough liquid coolant in order to maintain $Rate_{Line4}=Rate_{DesiredLine4}$. For example, in some instances, the primary heat exchanging loop may be unable to draw enough heat (e.g., according to the pump speed of CP) in order to maintain a sufficient flow of condensed liquid coolant. As another example, the primary heat exchanging loop may not produce enough condensed liquid coolant based on other factors (e.g., user controlled to operate below a threshold pump speed in order to conserve energy for driving CP). In either case, in order to maintain $Rate_{DesiredLine1}$, the system 1 may be configured to draw additional liquid coolant from the coolant source 3, to which the sensing system may be coupled, via $P_3$. In which case, the controller 7 may be configured to control the pump speed of $P_3$ in order to draw additional liquid coolant to be mixed with the condensed liquid coolant received from the condenser to be supplied to the IT enclosure (via the first line). In one embodiment, the controller may determine the pump speed of $P_3$ based on a difference between $Rate_{DesiredLine1}$ and $Rate_{Line4}$. For example, the controller may determine a desired flow rate through the third line, $Rate_{DesiredLine3}$ that is to be drawn from the coolant source through the third line 8c, such that $Rate_{Line3}=Rate_{DesiredLine1}-Rate_{Line4}$. With the desired rates, the controller uses (at least a portion)) of received sensor data from $FS_1$, $FS_3$, and $FS_4$, to control pump speeds of at least one of $P_1$ and $PS_3$ (and $P_4$, if coupled to and disposed between the sensing system and condenser), such that the $Rate_{DesiredLine1}$ is equal to the combination of $Rate_{Line3}$ and $Rate_{Line4}$.

FIG. 4 shows an example of the immersion cooling system 1 that is in a third (e.g., two-phase immersion cooling with local fluid circulation) configuration in which the sensing system is used to implement the two-phase immersion cooling according to one embodiment. Specifically, in this configuration the sensing system is actively circulating two-phase liquid coolant 30 through the IT enclosure and one or more cooling devices while providing two-phase immersion cooling to the (e.g., IT component 6 of the) electronics board 17.

As shown, the IT enclosure includes one or more additional components for providing the two-phase immersion cooling with local fluid circulation. Specifically, the IT enclosure includes a liquid supply manifold 45, a liquid return manifold 44, and a vapor manifold 43 that are coupled to an electronics device 40 (e.g., a server). The liquid supply manifold 45 is coupled to (e.g., the first line 8a of the sensing system, via) $P_1$, and is coupled to the electronics device 40. In one embodiment, the electronics device may be a server. The supply manifold is arranged to supply liquid coolant received from and externally managed by the sensing system into the electronic device 40. The liquid return manifold 44 is coupled to (e.g., the second line 8b of the sensing system, via) $P_2$, and is coupled to the electronics device 40. The return manifold is arranged to return liquid coolant from the electronics device into the return loop (e.g., via the second line 8b) that is managed by the sensing system. The vapor manifold 43 couples the electronics device 40 to the condenser 4, and is arranged to supply vapor from the electronics device into the condenser. In one embodiment, at least some of the manifolds may be coupled to one or more electronic devices.

The electronics device 40 includes a cooling device 41 (e.g., a liquid coolant plate), an (or one or more) IT component(s) 6, and a (or one or more) electronics board(s) 17. As illustrated, the IT component 6 is mounted onto the electronics board 17, and the cooling device 41 is coupled to the IT component. The cooling device includes liquid coolant 42, and is configured to draw heat from the IT component (e.g., when active), where the heat causes the liquid coolant to produce vapor. In addition, the electronics device is (at least partially) submerged within liquid coolant 30, which may be a single-phase or a two-phase liquid coolant. In one embodiment, liquid coolant 42 may be the same as liquid coolant 30. In another embodiment, it may have different characteristics than coolant 30. For instance, liquid coolant 42 may have a lower (or higher) boiling temperature than coolant 30. In another embodiment, coolant 30 may be a single-phase coolant, whereas the liquid coolant 42 may be a two-phase liquid coolant.

During operation of the immersion cooling system 1, the IT component (and/or electronics board) are cooled by (at least) two cooling loops: an immersion cooling loop and a circulation cooling loop. In the immersion cooling loop, heat generated by the IT component is transferred to the liquid coolant 30 in which the electronics device 40 is at least partially submerged. In one embodiment, the IT enclosure may be coupled to a condenser (not shown), which is configured to condense vapor produced by the heat being transferred into the liquid coolant 30 within the IT enclosure, in which coolant 30 is a two-phase liquid coolant. In another embodiment, the liquid coolant 30 may be a single-phase liquid coolant that is circulated through the IT enclosure via a single-phase heat exchanging loop that is coupled to a liquid-to-liquid heat exchanger (not shown).

In the circulation loop, liquid coolant is circulated by the sensing system 2. Specifically, the coolant 42 is circulated through the liquid supply manifold 45 (according to $P_1$) and through the liquid return manifold 44 (according to $P_2$), where the circulated liquid coolant 42 may also draw heat from the IT component. Heat drawn from the IT component causes the liquid coolant 42 to change into vapor, that is supplied to the condenser 4, via the vapor manifold 43. In one embodiment, the liquid coolant 42 may have a different (e.g., lower) boiling temperature than the liquid coolant 30, as described herein. In another embodiment, both liquid coolants may have a same boiling temperature.

In this two-phase immersion cooling with local liquid circulation, the controller 7 is communicatively coupled to (at least) $P_1$-$P_3$ (and $P_4$, optionally) and CP, and is configured to manage flow rates of liquid coolant flowing through the sensing system based on a determined $Rate_{DesiredLine1}$, as described herein. In one embodiment, the controller is configured to determine desired flow rates through one or more other lines. In particular, the controller may determine $Rate_{DesiredLine2}$, which may be defined in order to ensure that the desired amount of liquid coolant circulates through the cooling device 41. In one embodiment, $Rate_{DesiredLine2}$ may defined based on a predefined rate, and may be less than $Rate_{DesiredLine1}$. In some embodiments, the controller may determine the other desired flow rates as described herein, such that a combination of the desired flow rates is equal to (or approximately equal to) the desired flow rate through the first line (e.g., $Rate_{DesiredLine1} = Rate_{DesiredLine2} + Rate_{DesiredLine3} + Rate_{DesiredLine4}$).

The controller may be configured to use received sensor data from (at least one of) $FS_1$-$FS_4$ to control pump speeds of at least one of the liquid pumps, such that a combination of flow rates of liquid coolant flowing through the second, third, and fourth lines is equal to their desired flow rates, while the first litre is coupled to $P_1$, the second line is coupled to $P_2$, the third line is coupled to $P_3$, and the fourth line is coupled to the condenser 4 (or $P_4$). As a result, the controller may configure the one or more pumps such that the $Rate_{DesiredLine1} = Rate_{Line1} = Rate_{Line2} + Rate_{Line3} + Rate_{Line4}$.

In one embodiment, the sensing system may not be coupled to the (e.g., $P_3$ that is coupled to the) coolant source. As a result, the system may set the pump speeds based on $Rate_{DesiredLine1} = Rate_{Line1} = Rate_{Line2} + Rate_{Line3} + Rate_{Line4}$.

As described thus far, the controller may be configured to control pumps such that their respective flow rate sensors detect that liquid coolant flowing through the sensors equal the desired flow rates. In another embodiment, the flow of liquid coolant through one or more lines may not be equal to the desired flow rate. Instead, the controller may control one or more pumps such that a combination of flow rates through one or more lines is that are mixed by the intersection and flow into the first line achieves a $Rate_{Line1}$ detected by $FS_1$ to be (approximately) equal to $Rate_{DesiredLine1}$.

Figure 5:
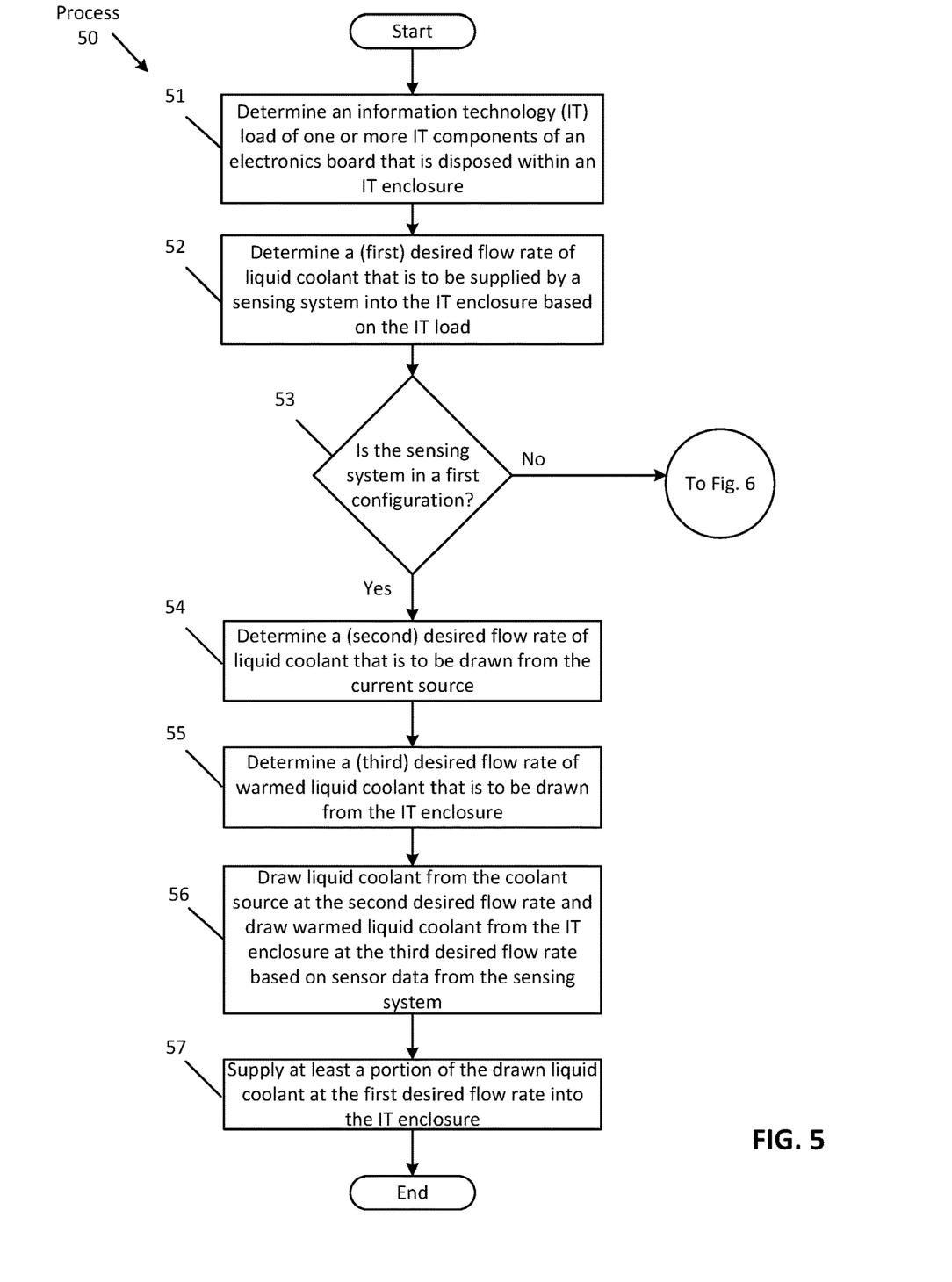
FIG. 5 is a flow chart of a process for operating the immersion cooling system in an immersion cooling configurations according to one embodiment.
Figure 6:
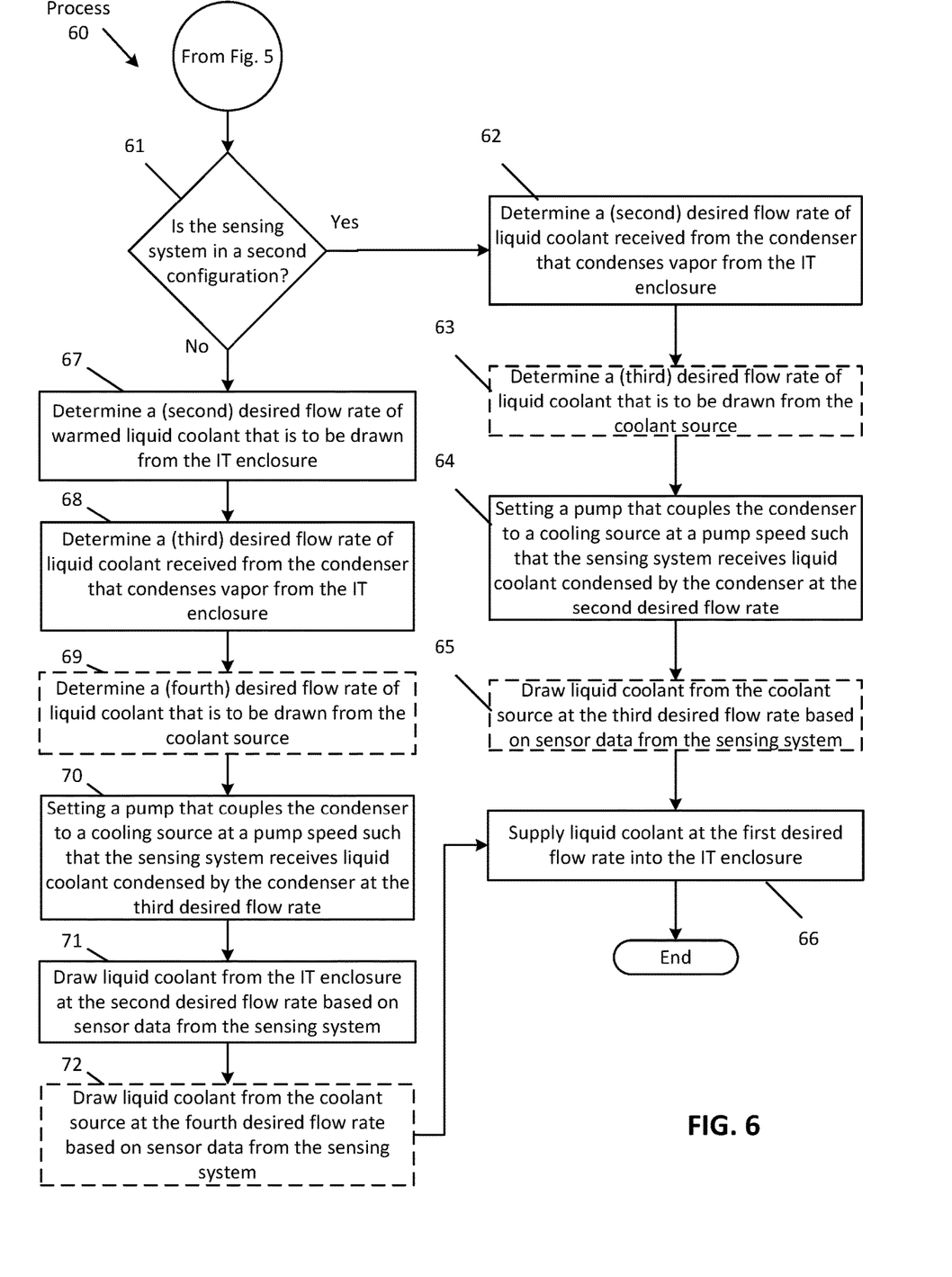
FIG. 6 is a flow chart of a process for operating the immersion cooling system in another immersion cooling configuration according to one embodiment.
Figure 7:
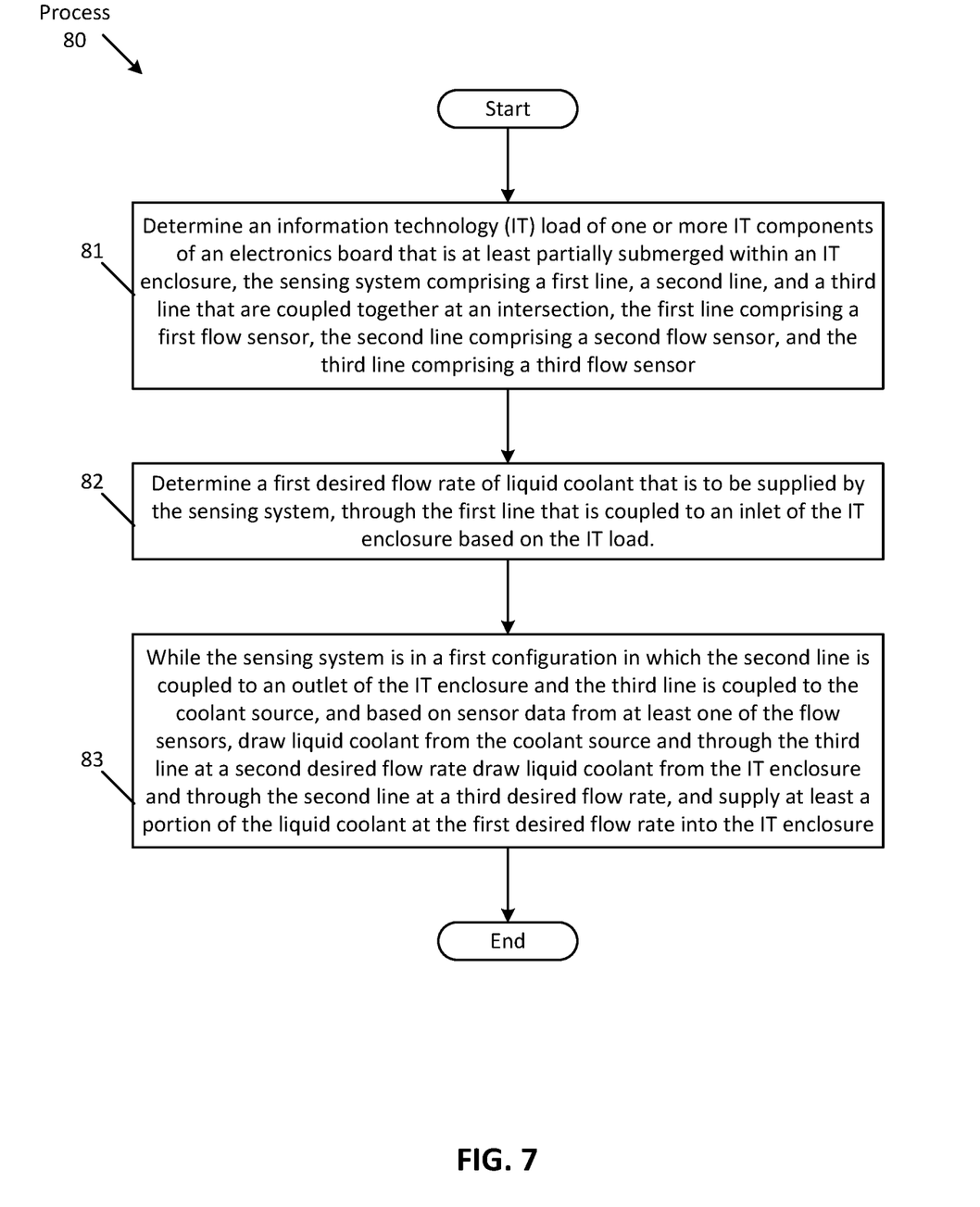
FIG. 7 is a flow chart of a process of the immersion cooling system that includes the sensing system operating in an immersion cooling configuration according to another embodiment.

FIGS. 5-7 are flow charts of processes for operating the immersion cooling system in immersion cooling configurations. In one embodiment, at least some of the operations of (at least some of) the processes in these figures may be performed by the (e.g., controller 7 of the) sensing system 2. In another embodiment, at least some of the operations described herein may be performed by a controller that is separate from the sensing system and communicatively coupled to the controller 7.

In one embodiment, the controller 7 may perform the (at least some of these) operations in (at least some of) FIGS. 5-7 automatically (e.g., without user intervention). For instance, the controller may initiate these operations upon detecting that the sensing system has been coupled to the immersion cooling system (e.g., upon receiving power by being turned on or plugged into a power source). In another embodiment, the controller may perform at least some of these operations upon determining that one or more lines of the sensing system have been coupled to lines (e.g., pumps) of the immersion cooling system. For instance, at least some of the ports 16a-16d may include sensors (e.g., contact sensors), which upon detecting that a connector has been coupled with the port transmits an electrical signal to the controller. Upon receiving the signal, the controller may perform at least some of these operations. In another embodiment, the controller may perform at least some of these operations based on user input (e.g., input at a client electronic device, such as a computer, that is communicatively coupled with the controller).

Turing to FIG. 5, this figure is a flow chart of a process 50 for operating the immersion cooling system in an immersion cooling configurations according to one embodiment. The process 50 begins by the controller determining an IT load of one or more IT components of an (or one or more) electronics board(s) that are disposed within (e.g., at least partially submerged within liquid coolant contained within) an IT enclosure (at block 51). Specifically, the controller 51 may determine the IT load based on data received from the IT components that indicate computational tasks that are currently being performed by the IT components. The controller determines a (first) desired flow rate of liquid coolant that is to be supplied by the sensing system into the IT enclosure based on the IT load (at block 52). Specifically, the controller may determine $Rate_{DesiredLine1}$ based on one or more parameters, such as the IT load, as described herein. For example, the controller may perform a table lookup into a data structure that associates one or more $Rate_{DesiredLine1}$ with the one or more parameters (e.g., IT loads). In another embodiment, the controller may input the IT load into a flow rate (predefined) model that outputs the desired flow rate in response to the IT load.

The controller determines whether the sensing system 2 is in a first (e.g., single-phase immersion cooling) configuration (at decision block 53). In one embodiment; the controller may make this determination based on user input (e.g., receiving user input that indicates the configuration of the immersion cooling system). In another embodiment, the controller may determine the configuration based upon determining whether one or more lines of the sensing system are coupled to one or more (external) lines (or line connectors). For example, the controller may determine that the sensing system is in the first configuration upon determining that ports 16a, 16b, 16c, and 20 are coupled to respective connectors. In another embodiment, the controller 7 may determine the configuration based on which pumps it is communicatively coupled to. For example, upon determining that the controller is coupled to $P_1$, $P_2$, and $P_3$, it may indicate the sensing system 2 is in the first configuration.

If the controller 7 determines that the system is in the first configuration (e.g., in which the second line 8b is coupled to liquid output 21 (or $P_2$) and the third line 8c is coupled to the coolant source 3 (or $P_3$), as shown in FIG. 2), the controller 7 determines a (second) desired flow rate (e.g., $Rate_{DesiredLine3}$) of liquid coolant that is to be drawn from the coolant source (at block 54). The controller determines a (third) desired flow rate (e.g., $Rate_{DesiredLine2}$) of warmed liquid coolant that is to be drawn from the IT enclosure (at block 55). As described herein, these desired flow rates may be equal to the $Rate_{DesiredLine1}$, in order to maintain a constant flow of liquid coolant throughout the system. As another example, the desired flow rates may be different based on whether at least a portion of the warmed liquid coolant flowing through the second line is being circulated back into the system (e.g., based on whether valve 25 in FIG. 2 is at least partially open).

The controller 7 draws liquid coolant from the coolant source at the second desired flow rate and draws warmed liquid coolant from the IT enclosure at the third desired flow rate based on sensor data from the sensing system (at block 56). Specifically, the warmed liquid coolant may be (at least partially) expelled through port 20. In one embodiment, the controller may determine a pump speed at which a pump, such as $P_3$ that is coupled to the third line 8c such that liquid coolant flows through the third line at the first desired flow rate, and sets the pump to the pump speed. For example, the controller may set the pump to a (e.g., predefined) pump speed, and then monitor $Rate_{Line3}$ from $FS_3$. The controller may compare $Rate_{Line3}$ to $Rate_{DesiredLine3}$, and based on the difference adjust the pump speed. As a result, if $Rate_{Line3}$ is less than $Rate_{DesiredLine3}$, the controller may increase the pump speed of $P_3$ until $Rate_{Line3}$ is equal to (within a threshold of) $Rate_{DesiredLine3}$.

The controller supplies at least a portion of the drawn liquid coolant at the first desired flow rate into the IT enclosure (at block 57). As described herein, the supplied liquid coolant may be entirely from the coolant source, or may be a mixture of warmed liquid coolant flowing through the second line and liquid coolant flowing through the third line.

FIG. 6 is a flow chart of a process 60 for operating the immersion cooling system in another immersion cooling configuration according to one embodiment. Specifically, the controller 7 may (at least partially) perform the process 60 in response to determining that the sensing system is not in the first configuration, as determined in decision block 53 in FIG. 5. The process 60 begins by the controller determining whether the sensing system is in a second (two-phase immersion cooling) configuration (at decision block 61). If the controller determines that the system is in the second configuration (e.g., in which the first line 8a is coupled to the IT enclosure (and/or $P_1$), the fourth line 8d is coupled to the condenser 4 (and/or $P_4$), and/or the third line 8c is coupled to the coolant source 3 (and/or $P_3$)), the controller determines a (second) desired flow rate of liquid coolant to be received from the condenser (e.g., $Rate_{DesiredLine4}$) that condenses vapor 31 from the IT enclosure 15 (at block 62). In one embodiment, $Rate_{DesiredLine4}$ may be based on the liquid cooling capacity of the condenser 4. For instance, the cooling capacity may be based on predefined parameters of the condenser and/or based on the (e.g., maximum) pump speed of CP. The controller (optionally) determines a (third) desired flow rate of liquid coolant that is to be drawn from the coolant source (at block 63). For example, $Rate_{DesiredLine4}$ is less than $Rate_{DesiredLine1}$, the controller may define $Rate_{DesiredLine3}$ based on the difference, such that $Rate_{DesiredLine1} = Rate_{DesiredLine3} + Rate_{DesiredLine4}$.

The controller 7 sets a pump that couples the condenser to a cooling source (e.g., CP) at a pump speed such that the sensing system receives liquid coolant condensed by the condenser at the second desired flow rate (at block 64). The controller draws liquid coolant from the coolant source at the third desired flow rate based on sensor data from the sensing system (at block 65). For example, as described herein, the controller may set the pump speeds of CP and $P_3$, and then adjust the pump speeds based on whether flow rates of respective flow sensors are equal to (or within a threshold of) their lines desired flow rates. The controller supplies the drawn liquid coolant at the first desired flow rate into the IT enclosure (at block 66). For instance, when liquid coolant is being drawn from the condenser and the coolant source, the desired flow rate into the IT enclosure may be equal to (or a combination of) the (desired) flow rates within the fourth and third lines.

If, however, the sensing system is not in the second configuration, the controller may determine that the immersion cooling system is in a third (e.g., two-phase immersion cooling with local fluid circulation) configuration (e.g., in which the first line 8a is coupled to the IT enclosure (and/or $P_1$), the second line 8b is coupled to the IT enclosure (and/or $P_2$), the fourth line 8d is coupled to the condenser 4 (and/or $P_4$), and/or the third line 8c is coupled to the coolant source 3 (and/or $P_3$)). The controller 7 determines a (second) desired flow rate of warmed liquid coolant that is to be drawn from the IT enclosure (at block 67). The controller determines a (third) desired flow rate of liquid coolant that is to be received from the condenser that condenses vapor from the IT enclosure (at block 68). The controller determines a (fourth) desired flow rate of liquid coolant that is to be drawn from the coolant source (at block 69).

The controller sets a pump that couples the condenser to a cooling source at a pump speed such that the sensing system receives liquid coolant condensed by the condenser at the third desired flow rate (at block 70). The controller draws liquid coolant form the IT enclosure at the second desired flow rate based on sensor data from the sensing system (at block 71). The controller draws liquid coolant from the coolant source at the fourth desired flow rate based on sensor data from the sensing system (at block 72). The controller then supplies liquid coolant at the first desired flow rate into the IT enclosure, which is a combination of the second, third, and fourth desired flow rates (at block 66).

FIG. 7 is a flow chart of a process 80 of the immersion cooling system that includes the sensing system operating in an immersion cooling configuration according to another embodiment. The process 80 begins by the controller determining an information technology (IT) load of one or more IT components of an electronics board that is at least partially submerged within an IT enclosure, the sensing system comprising a first line, a second line, and a third line that are coupled together at an intersection, the first line comprising a first flow sensor, the second line comprising a second flow sensor, and the third line comprising a third flow sensor (at block 81). The controller determines a first desired flow rate of liquid coolant that is to be supplied by the sensing system, through the first line that is coupled to an inlet of the IT enclosure based on the IT load (at block 82). The controller, while the sensing system is in a first configuration in which the second line is coupled to an outlet of the IT enclosure and the third line is coupled to the coolant source, and based on sensor data from at least one of the flow sensors, draw liquid coolant from the coolant source and through the third line at a second desired flow rate draw liquid coolant from the IT enclosure and through the second line at a third desired flow rate, and supply at least a portion of the liquid coolant at the first desired flow rate into the IT enclosure (at block 83).

Some embodiments may perform variations of the processes described herein. For example, the specific operations of the processes may not be performed in the exact order shown and described. The specific operations may not be performed in one continuous series of operations and different specific operations may be performed in different embodiments. For example, at least some of the operations described herein may be performed in series or may be performed (at least partially) contemporaneously. For instance, the controller may draw liquid coolant and supply the liquid coolant at (approximately) the same time.

In some embodiments, several blocks described herein are illustrated as having dashed boundaries, which include optional operations. For example, the operations performed in blocks 63 and 65 may be optional. This may be the case when the immersion cooling system is able to receive sufficient liquid coolant from the condenser, such that $Rate_{Line4}$ is equal to $Rate_{DesiredLine1}$.

As described herein, the controller is configured to determine desired flow rates of liquid coolant flowing through the second, third, and fourth lines $8b$-$8d$. In one embodiment, the controller may be configured to determine the desired flow rate through the first line $8a$, and may be configured to draw liquid coolant through one or more of the other lines such that a combined flow rate of those lines is equal to the desired flow rate through the first line. In other words, the controller may configure one or more of the pumps (based on flow rates through their respective lines determined by flow sensors) in order to draw sufficient liquid coolant, without having to determine one or more of $Rate_{DesiredLine2}$, $Rate_{DesiredLine3}$, and/or $Rate_{DesiredLine4}$.

According to one embodiment, a sensing system for an immersion cooling system, the sensing system comprising: a first flow sensor that is coupled to a first line, a second flow sensor that is coupled to a second line, and a third flow sensor that is coupled to a third line, the flow sensors are arranged to sense flow rates of liquid coolant flowing through their respective lines as sensor data; and a controller that is communicatively (or electrically) coupled to all of the flow sensors and is configured to receive the sensor data from each of the flow sensors, wherein the first, second, and third lines are fluidly coupled together at an intersection such that the liquid coolant may flow between the lines, wherein the first is arranged to couple to a first pump for pushing liquid coolant drawn from the first line into an information technology (IT) enclosure that includes at least one electronics board, the second line is arranged to couple to a second pump for pushing liquid coolant drawn from the IT enclosure into the second line, and the third line is arranged to couple to a third pump for pushing liquid coolant drawn from a coolant source into the third line, the liquid coolant drawn from the first line is from at least one of the second line and the third line, and wherein the controller is arranged to communicatively couple to the first, second, and third pumps and is configured to control pump speeds of at least one of the pumps based on the received sensor data.

As previously explained, an embodiment of the disclosure may be (or include) a non-transitory machine-readable medium (such as microelectronic memory) having stored thereon instructions, which program one or more data processing components (generically referred to here as a "processor") to perform liquid flow rate management operations, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain embodiments have been described and shown in the accompanying drawings, it is to be understood that such embodiments are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some embodiments, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some embodiments, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A sensing system for an immersion cooling system, the sensing system comprising:
    a first flow sensor to sense a flow rate of liquid coolant flowing through a first line having a first pump to push liquid coolant into an information technology (IT) enclosure that includes at least one electronics board;
    a second flow sensor to sense a flow rate of liquid coolant flowing through a second line having a second pump for receiving liquid coolant from the IT enclosure;
    a third flow sensor to sense a flow rate of liquid coolant flowing through a third line having a third pump to receive liquid coolant from a coolant source, wherein the liquid coolant drawn from the first line is received from at least one of the second line and the third line, wherein the first, second, and third lines are fluidly coupled together at an intersection such that the liquid coolant can flow between the first, second, and third lines; and
    a controller to receive sensor data from each of the first, second, and third flow sensors and to control pump speeds of at least one of the first, second, and third pumps based on the sensor data.

2. The sensing system of claim 1 further comprises a port that is coupled to the second line and is arranged to allow liquid coolant that is pushed into the second line by the second pump to be expelled out of the sensing system.

3. The sensing system of claim 2, wherein the controller is configured to:
    determine a desired flow rate of liquid coolant to be supplied by the sensing system into the IT enclosure through the first line based on an IT load of one or more IT components of the at least one electronics board, and
    use the sensor data to control the pump speeds of at least one of the first, second, and third pumps such that 1) liquid coolant is supplied through the first line at the desired flow rate and 2) the flow rate of liquid coolant flowing through the second line and out of the port at a flow rate and the flow rate of liquid coolant flowing through the third line are both equal to the desired flow rate.

4. The sensing system of claim 1 further comprising a fourth flow sensor to sense a flow rate of liquid coolant flowing through a fourth line that is coupled to the first, second, and third lines at the intersection, the fourth line is coupled to a condenser that is arranged to receive vapor produced by the IT enclosure and condense the vapor into liquid coolant that is received by the fourth line.

5. The sensing system of claim 4, wherein the controller is further configured to:
determine a desired flow rate of liquid coolant to be supplied by the sensing system into the IT enclosure through the first line based on an IT load of one or more electronics components of the at least one electronics board, and
use at least a portion of the received sensor data to control pump speeds of at least one of the first and fourth pumps such that liquid coolant is supplied through the first line at the desired flow rate and a flow rate of liquid coolant flowing through the fourth line from the condenser is equal to the desired flow rate.

6. The sensing system of claim 5, wherein the controller is configured to
use at least a portion of the sensor data to control pump speeds of at least one of the first, third, and fourth pumps such that the desired flow rate is equal to a combination of the flow rate of liquid coolant flowing through the third line and the flow rate of liquid coolant flowing through the fourth line.

7. The sensing system of claim 6, wherein the controller is configured to use the received sensor data to control pump speeds of at least one of the first, second, third, and fourth pumps such that a combination of flow rates of liquid coolant flowing through the second, third, and fourth lines is equal to the desired flow rate of liquid coolant flowing through the first line.

8. The sensing system of claim 1 further comprising a housing in which the sensors, the lines, and the controller are integrated therein.

9. A method performed by a sensing system, the method comprising:
determining an information technology (IT) load of one or more IT components of an electronics board that is at least partially submerged within an IT enclosure, the sensing system comprising a first line, a second line, and a third line that are coupled together at an intersection, the first line comprising a first flow sensor, the second line comprising a second flow sensor, and the third line comprising a third flow sensor;
determining a first desired flow rate of liquid coolant that is to be supplied by the sensing system, through the first line that is coupled to an inlet of the IT enclosure based on the IT load;
while the sensing system is in a first configuration in which the second line is coupled to an outlet of the IT enclosure and the third line is coupled to a coolant source, and based on sensor data from at least one of the flow sensors, drawing liquid coolant from the coolant source and through the third line at a second desired flow rate;
drawing liquid coolant from the IT enclosure and through the second line at a third desired flow rate; and
supplying at least a portion of the drawn liquid coolant at the first desired flow rate into the IT enclosure.

10. The method of claim 9, wherein the sensing system further comprises a port that is coupled to the second line and is arranged to allow liquid coolant drawn from the IT enclosure to be expelled out of the sensing system, wherein the supplied liquid coolant into the IT enclosure is from the coolant source with the second and third desired flow rates being equal to the first desired flow rate.

11. The method of claim 9, wherein drawing liquid coolant from the coolant source comprises:
determining a pump speed at which a pump coupled to the third line such that liquid coolant flows through the third line at the second desired flow rate; and
setting the pump to the pump speed.

12. The method of claim 9 further comprising, while the sensing system is in a second configuration in which 1) a vapor inlet of a condenser is coupled to a vapor outlet of the IT enclosure, 2) the second line is coupled to a liquid coolant outlet of the condenser and 3) a pump couples the condenser to a cooling source, and based on sensor data from at least one of the flow sensors
setting the pump at a pump speed such that the second line receives liquid coolant condensed by the condenser at a second desired flow rate;
drawing liquid coolant from the coolant source at a third desired flow rate; and
supplying the liquid coolant at the first desired flow rate, which is a combination of the second and third desired flow rates.

13. The method of claim 9 further comprising, while the sensing system is in a third configuration in which 1) the second line is coupled to an outlet of the IT enclosure, 2) the third line is coupled to a coolant source, 3) a vapor inlet of a condenser is coupled to a vapor outlet of the IT enclosure, 4) the fourth line is coupled to a liquid coolant outlet of the condenser, and 5) a pump couples the condenser to a cooling source, and based on sensor data from at least one flow sensor,
drawing liquid coolant from the outlet of the IT enclosure at a second desired flow rate;
drawing liquid coolant from the coolant source at a third desired flow rate;
setting the pump at a pump speed such that the fourth line receives liquid coolant condensed by the condenser from vapor received by the condenser from the IT enclosure at a fourth desired flow rate; and
supplying the liquid coolant at the first desired flow rate, which is a combination of the second, third, and fourth desired flow rates.

* * * * *